Oct. 10, 1967 H. F. STRENGLEIN 3,346,743

PULSE WIDTH MULTIPLYING CIRCUIT HAVING CAPACITIVE FEEDBACK

Filed April 26, 1965

INVENTOR.
HARRY F. STRENGLEIN
BY
John H. Gallagher
ATTORNEY

United States Patent Office 3,346,743

Patented Oct. 10, 1967

3,346,743

PULSE WIDTH MULTIPLYING CIRCUIT HAVING CAPACITIVE FEEDBACK

Harry F. Strenglein, Clearwater, Fla., assignor to Sperry Rand Corporation, Great Neck, N.Y., a corporation of Delaware Filed Apr. 26, 1965, Ser. No. 450,652
6 Claims. (Cl. 307—88.5)

ABSTRACT OF THE DISCLOSURE

A circuit for multiplying or stretching the width of a pulse by permitting a negative feedback capacitor of a two-stage amplifier to discharge for a longer period than required for it to charge. The amplifier in its quiescent state has a first stage which is saturated and a second stage that is cut-off. When a pulse is applied to the base of a transistor switch, the first stage of the amplifier comes out of saturation while continuing to conduct. This permits the second stage emitter follower to begin conducting and a capacitor connected between the emitter of the emitter follower and the base of a transistor of the first stage begins charging. The capacitor may also be charged through the transistor switch. At the end of the original pulse, the switch is cut-off, and the capacitor discharges through the base of the first stage of the transistor amplifier thereby requiring a longer time for the capacitor to discharge than charge resulting in increased output pulse width.

This invention relates to an electronic circuit for multiplying, or stretching, the width of a pulse waveform.

Pulse width multiplying circuits find use in a number of different applications, such as in analog computers to multiply a quantity, expressed in terms of a pulse duration, by a given factor *m*, and also may be used to translate pulse information between two different electronic information handling systems where the second system cannot process short duration pulses because of bandwidth limitations of its circuits and/or components. The circuit of the present invention also may be employed to produce a proportional time delay by initiating a signal that commences after a time interval that is a multiple of the duration of the input pulsed signal.

Pulse width multiplication is achieved in accordance with the present invention by providing a gating means for coupling the input pulse signal to the base of a transistor amplifier that is connected in the grounded emitter configuration. A feedback path that includes an emitter follower amplifier and a capacitor is provided about the grounded emitter amplifier. The base of a three terminal transistor is connected to the output of the emitter follower, while the emitter of the transistor is connected to a reference voltage (ground potential) which will maintain the emitter follower amplifier cut off during the quiescent condition of the circuit during which the grounded emitter amplifier and the transistor both are saturated. The output terminal is coupled to the collector of the transistor.

When an input pulse is applied through the gating means the grounded emitter amplifier comes out of saturation, but still conducts. The emitter follower amplifier begins to conduct and cuts off the transistor, thereby unclamping the output of the emitter follower amplifier. The capacitor begins to accumulate a charge, in a Miller integrator fashion, due to a current that flows in a path that includes the gating means as one branch. At the conclusion of the input pulse the gate closes and the capacitor begins to discharge at a slower rate than it charged because the path of the discharge current does not include the gating means. When the charge on the capacitor falls to the level at which the integrating action concludes, the base to emitter junction of the transistor again clamps the emitter follower output to the reference voltage. The multiplied output signal is taken from the collector of the transistor which was at a steady magnitude all during the charging and discharging period of the capacitor during which transistor was cut off, thereby providing a multiplied output pulse whose duration is proportional to the duration of the input pulse.

Figure 1:
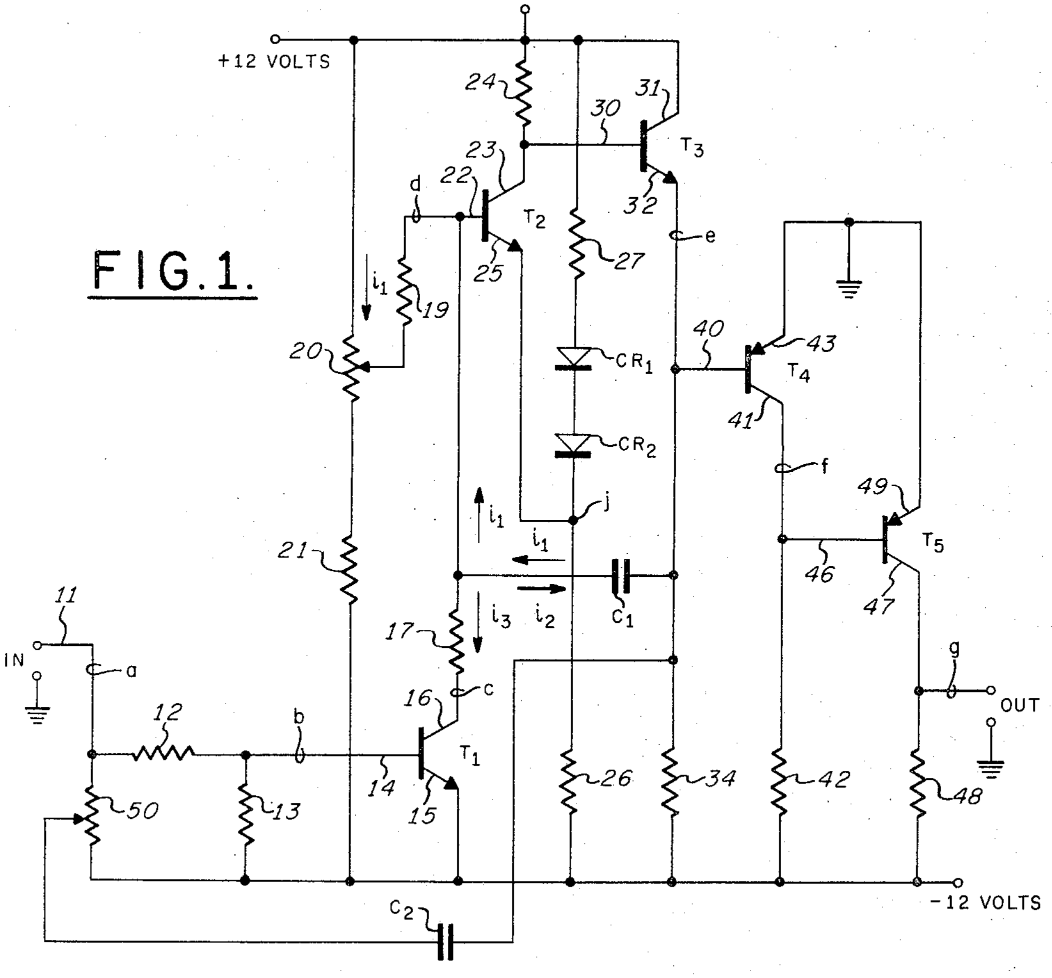
Figure 2:
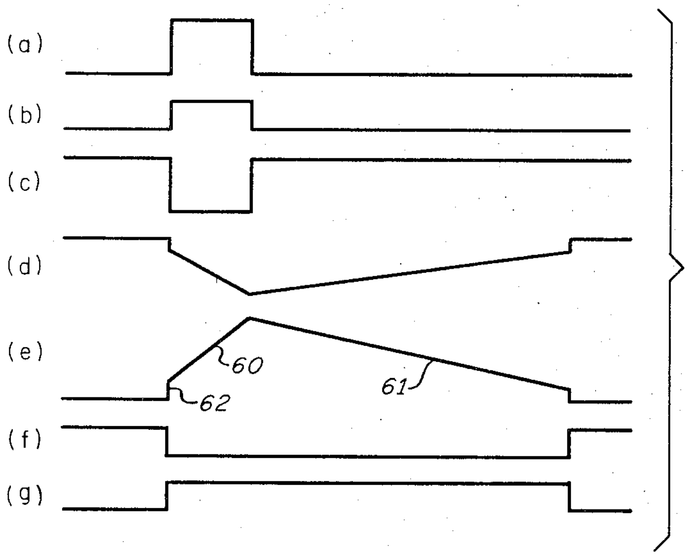

The invention will be described in connection with the accompanying drawings wherein:

FIG. 1 is a schematic diagram of the pulse width multiplier circuit of this invention; and FIG. 2 is a series of waveforms used in explaining the operation of the circuit of FIG. 1.

Referring now to FIG. 1 for a detailed description of the circuit of this invention, a rectangularly shaped positive going pulse, FIG. 2*a*, is coupled from input terminal 11, through voltage dropping resistor 12 and the voltage developed across input resistor 13 is coupled to base 14 of transistor $T_1$, which is an npn transistor coupled in the grounded emitter configuration. The emitter 15 of transistor $T_1$ is directly connected to the −12 volt supply line and the collector 16 is coupled through resistors 17, 19, and potentiometer 20 to the +12 volt supply line. The collector 16 of the transistor $T_1$ also is coupled to the base 22 of transistor $T_2$ whose collector 23 is coupled through resistor 24 to the +12 volt supply line and whose emitter 25 is connected through resistor 26 to the −12 volt supply line. Resistor 26 together with resistor 27 constitute a voltage divider whose junction *j* is below ground potential since resistor 27 is chosen to be larger than resistor 26. Transistor $T_2$ is therefore connected in the grounded emitter configuration. The voltage applied from potentiometer 20 to base 22 is of the proper magnitude to maintain transistor $T_2$ normally conducting in its saturation state. Crystal diodes $CR_1$ and $CR_2$ are connected between resistor 26 and junction *j* and serve a temperature compensating role in the operation of the circuit. The output signal from transistor $T_2$ is coupled to base 30 of the transistor $T_3$ whose collector 31 is directly connected to the +12 volt supply line and whose emitter 32 is connected through resistor 34 to the −12 volt supply line. Transistor $T_3$ is therefore connected in an emitter follower configuration.

Capacitor $C_1$ is connected between the emitter 32 of transistor $T_3$ and the base 22 of transistor $T_2$ and thereby forms a feedback path between the two transistors.

The base 40 of pnp transistor $T_4$ is coupled to the output of emitter follower transistor $T_3$, and the emitter 43 of transistor $T_4$ is connected directly to ground while the collector 41 is coupled through resistor 42 to the −12 volt supply line. Transistor $T_4$ therefore is connected in a grounded emitter configuration and its output at collector 41 is coupled to base 46 of transistor $T_5$, whose collector 47 is coupled through resistor 48 to the −12 volt supply line, and whose emitter 49 is directly connected to ground. Pnp transistor $T_5$ also is connected in a grounded emitter configuration and the circuit output is taken from its collector 47. The input signal from input terminal 11 also is coupled from potentiometer 50 through capacitor $C_2$ to the right side of capacitor $C_1$, this point also being common to the base 40 of transistor $T_4$.

In the quiescent condition of the circuit the conduction states of the transistors are as follows. Transistor $T_1$ is non-conducting. Transistor $T_2$ is conducting in saturation because its base is above ground potential and its emitter is below ground potential. Pnp transistor $T_4$ is conducting and therefore its base 40, and also the emitter 32 of transistor $T_3$, is just slightly below ground potential by an amount equal to the base-emitter drop of transistor $T_4$. The base 30 of transistor $T_3$ is negative so as to hold transistor $T_3$ in the non-conducting state during this quiescent condition of the circuit. Transistor $T_5$ is normally non-conducting. During the quiescent condition of the circuit the right side of capacitor $C_1$ has a slight negative charge and the left side has a positive charge.

In the operation of the circuit of FIG. 1, the rectangularly shaped pulse of FIG. 2*a* is received at input terminal 11, is dropped in magnitude by resistor 12, and is applied as the reduced height pulse of FIG. 2*b* to the base 14 to cause transistor $T_1$ to conduct in the saturation state. Transistor $T_1$ serves the function of a switch to couple the input pulse of FIG. 2*a* to the active portion of the circuit. The input pulse of FIG. 2*a* also is coupled through potentiometer 50 and capacitor $C_2$ to the right side of capacitor $C_1$. The conduction of transistor $T_1$ causes its collector potential, FIG. 2*c*, to immediately fall in the negative direction. At this instant of time, capacitor $C_1$ will immediately begin to charge by accumulating a positive charge on its right side while its left side immediately goes in the negative direction. The positive pulse applied from potentiometer 50 also is applied to base 40 of transistor $T_4$ and renders this transistor non-conducting. When transistor $T_4$ turns off, the emitter 32 of transistor $T_3$ no longer is clamped to substantially ground potential. With the conduction of transistor $T_1$, the potential on the base 22 of transistor $T_2$ immediately falls in the negative direction and transistor $T_2$ comes out of saturation but continues to conduct. With transistor $T_2$ out of saturation and the emitter 32 of transistor $T_3$ no longer clamped at substantially ground potential the circuit that includes transistor $T_2$, transistor $T_3$, and capacitor $C_1$ now may function as an integrating feedback amplifier of the Miller integrator type. In this operating condition with the amplifier unclamped and developing full gain, the capacitance of capacitor $C_1$ effectively is multiplied by the gain of the feedback amplifier loop formed by transistors $T_2$ and $T_3$, and the capacitor $C_1$ charges slowly, as illustrated by the charging slope 60 that follows the rapid initial step 62 on the waveform of FIG. 2*e*. The charging rate of capacitor $C_1$ is determined by the net current supplied thereto, i.e., the difference between the currents through resistors 17 and 19, assuming that the current through resistor 17 is greater than through resistor 19.

At the conclusion of the positive input pulse of FIG. 2*a*, the signal of FIG. 2*b* that is applied to base 14 of transistor $T_1$ falls to its original potential and the gating transistor $T_1$ immediately ceases conducting. Capacitor $C_1$ now will begin to discharge in the conventional Miller integrator fashion. The discharge circuit for capacitor $C_1$ no longer includes two parallel paths since gating transistor $T_1$ is now non-conducting. Therefore, the conduction path from the left side of capacitor $C_1$ now includes only the path through resistor 19 and potentiometer 20 to the +12 volt supply line and the discharge of capacitor $C_1$ will be at a rate determined by the current through this path, this rate of discharge being represented by the gradually declining slope 61 of the waveform of FIG. 2*e*.

The technique of coupling the input signal, FIG. 2*a*, from potentiometer 50 through capacitor $C_2$ to the right side of feedback capacitor $C_1$ serves the function of giving a rapid start to the charging of capacitor $C_1$, thereby assuring a rapid and linear rise at the initial step 62 on the waveform of FIG. 2*e*. It should be understood that the basic overall operating characteristics of the circuit of FIG. 1 would not be drastically altered should this second input from potentiometer 50 be eliminated.

The multiplication factor *m* achieved in the pulse width multiplying circuit of FIG. 1 is a function of the ratio of the charging current to the discharging current of feedback capacitor $C_1$ and may be expressed as $$m=\frac{i_2}{i_1}+1$$

where $i_2$ is the net current that charges capacitor away from its quiescent state during the charging portion of the operating cycle. In the circuit of FIG. 1 this current $i_2$ is the difference between the current $i_3$ (current through resistor 17) and the current $i_1$ (the current through resistor 19).

During the time interval that capacitor $C_1$ was charging and discharging in the Miller integrator fashion the base 40 of transistor $T_4$ was at a sufficiently positive potential to keep transistor $T_4$ cut off so that its collector potential, FIG. 2*f*, was at a steady negative potential. Transistor $T_5$ serves as an inverting amplifier to produce a positive going rectangularly shaped multiplied pulse, as illustrated by the waveform of FIG. 2*g*. By comparing the waveforms of FIG. 2*a* and FIG. 2*g*, it may be seen that the width of the input waveform FIG. 2*a* has been multiplied to the considerably longer width of the output waveform FIG. 2*g*.

Considering further the function performed by transistor $T_4$ in the operation of the circuit it may be seen that it uniquely performs a dual function. That is, the base to emitter junction of transistor $T_4$ serves as a clamp during the quiescent portion of the operating cycle and during the very initial stages of the operating cycle to hold transistor $T_3$ in a non-conducting state, while on the other hand its base to collector junction provides an indication of the operating condition of the integrating feedback amplifier, thereby to produce the rectangularly shaped output pulse whose duration is determined by the time constant characteristics of the feedback amplifier.

The multiplication factor *m* of the circuit, which determines by what multiple the duration of the output waveform of FIGS. 2*f* or 2*g* exceeds the duration of the input waveform of FIG. 2*a*, may be adjusted by the positioning of the movable tap on potentiometer 20.

In one embodiment of the invention constructed as illustrated in FIG. 1, the circuit parameters had the following approximate values:

| | | |
|---|---|---|
| Resistors: | | |
| **12** | ohms | 100K |
| **13** | do | 33K |
| **17** | do | 68K |
| **19** | megohms | 2K |
| **21** | ohms | 40.2K |
| **24** | do | 560K |
| **26** | do | 2210K |
| **27** | do | 2320K |
| **34** | do | 100K |
| **42** | do | 10K |
| **48** | do | 10K |
| Potentiometers: | | |
| **20** | do | 2K |
| **50** | do | 10K |
| Capacitors: | | |
| $C_1$ | microfarads | 2 |
| $C_2$ | do | 0.1 |

With the above values of circuit parameters the circuit was capable of providing a multiplication factor *m* having a value between 27 and 30.

| | |
|---|---|
| Transistors: | |
| $T_1$ | 2N2926 |
| $T_2$,$T_3$ | 2N3391 |
| $T_4$,$T_5$ | 2N404 |
| Diodes $CR_1$, $CR_2$ | 1N461 |

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A pulse width multiplier circuit comprising, a signal inverting amplifier, a non-inverting signal amplifier coupled to receive the output of said inverting amplifier, capacitive means coupled between the output of said non-inverting amplifier and the input of said inverting amplifier, gating means coupled to the input of said inverting amplifier for applying a pulsed signal thereto, clamping means coupled to the output of said output terminal of said non-inverting amplifier for clamping said output terminal to a reference voltage prior to the time said pulsed signal is applied to said inverting amplifier and for unclamping the output terminal of the non-inverting amplifier in response to a signal passed by the non-inverting amplifier, and means operable in response to said clamping means for producing an output signal when the non-inverting amplifier output terminal is unclamped.

2. Apparatus for multiplying the width of a pulsed signal comprising, a grounded emitter transistor amplifier, an emitter follower transistor amplifier coupled to receive the output of said grounded emitter amplifier, capacitor means coupled between the output of said emitter follower amplifier and the input of said grounded emitter amplifier, gating means for applying a pulsed signal to an input terminal of said grounded emitter amplifier, a transistor having base, emitter and collector terminals, the base terminal of said transistor being connected to the output terminal of said emitter follower amplifier, the emitter terminal of said transistor being connected to a source of potential that will maintain said emitter follower amplifier in the nonconducting state in the absence of a pulsed signal being applied to said gating means, the collector electrode of said transistor being coupled through impedance means to a source of potential to permit said transistor to conduct only in the absence of a signal on the output terminal of said emitter follower amplifier, and means for obtaining an output signal from the collector of said transistor.

3. The combination claimed in claim 2 and further including, means for also coupling said input pulsed signal to the side of said capacitor means that is coupled to the output terminal of said emitter follower amplifier.

4. The combination claimed in claim 2, wherein said gating means is comprised of a switching transistor.

5. The combination claimed in claim 2, wherein said grounded emitter amplifier includes a transistor having a base electrode and further including, means for applying a selectable biasing potential to said base electrode.

6. Pulse width multiplying means comprising, an amplifier having an input terminal and an output terminal, means including capacitative means coupled between the input and output terminals of said amplifier to provide a negative feedback path therebetween, gating means coupled to said feedback path at a point between said input terminal and said capacitive means for applying a pulsed signal to said amplifier, means coupled to said feedback path at a point between the output terminal of said amplifier and said capacitive means for clamping said output terminal at a reference voltage prior to the time said pulsed signal is applied to said input terminal and for unclamping the output terminal in response to a signal produced by the amplifier in response to said pulsed input signal, means operable in response to said clamping means for producing an output signal when the amplifier output terminal is unclamped, and means for also applying said input pulse signal to the output terminal of said amplifier.

References Cited

UNITED STATES PATENTS

| | | | |
|---|---|---|---|
| 3,067,344 | 12/1962 | Branum et al. | 307—88.5 |
| 3,098,939 | 7/1963 | Clapper | 307—88.5 |

FOREIGN PATENTS

| | | |
|---|---|---|
| 748,204 | 4/1956 | Great Britain. |

ARTHUR GAUSS, *Primary Examiner.*

S. D. MILLER, *Assistant Examiner.*